United States Patent [19]

Lemelson

[11] 4,390,586

[45] Jun. 28, 1983

[54] ELECTRICAL DEVICE OF SEMI-CONDUCTING MATERIAL WITH NON-CONDUCTING AREAS

[76] Inventor: Jerome H. Lemelson, 85 Rector St., Metuchen, N.J. 08840

[21] Appl. No.: 919,412

[22] Filed: Jun. 26, 1978

Related U.S. Application Data

[63] Continuation of Ser. No. 660,800, Feb. 24, 1976, abandoned, which is a continuation-in-part of Ser. No. 294,837, Oct. 4, 1972, abandoned, which is a continuation of Ser. No. 849,012, Aug. 11, 1969, abandoned, which is a continuation-in-part of Ser. No. 442,875, Nov. 24, 1964, Pat. No. 3,461,347, which is a continuation of Ser. No. 86,838, Dec. 27, 1960, Pat. No. 3,169,892.

[51] Int. Cl.³ .................. B32B 3/00; B32B 7/00
[52] U.S. Cl. .................. 428/209; 428/210; 428/212; 428/901
[58] Field of Search .......... 427/86, 88, 93, 96, 427/98, 99, 101, 102, 282, 259, 331, 337, 343, 344, 393, 399, 404; 148/6.3; 428/195, 209, 210, 212, 469, 901

[56] References Cited

U.S. PATENT DOCUMENTS

| | | | |
|---|---|---|---|
| 3,114,663 | 12/1963 | Klerer | 148/179 |
| 3,115,423 | 12/1963 | Ashworth | 427/96 |
| 3,169,892 | 2/1965 | Lemelson | 148/6.3 |
| 3,461,347 | 8/1969 | Lemelson | 118/49 X |
| 3,801,366 | 4/1974 | Lemelson | 427/53.1 |

FOREIGN PATENT DOCUMENTS

| | | | |
|---|---|---|---|
| 939394 | 10/1963 | United Kingdom | 427/96 |

*Primary Examiner*—Marion McCamish

[57] ABSTRACT

An electrical device is provided forming an electrical component or circuit capable of performing such functions as storing, switching or gating electrical signals. The electrical device or circuit is formed at least in part of an anodizable, semi-conducting material by the controlled anodization or oxidation of a selected portion of such material to form a non-conducting portion thereof or a portion thereof in which the semi-conducting material has its capability of conducting electricity substantially reduced. In one form, the portion of the electrical device or circuit which is rendered non-conducting by oxidation or anodization serves to separate semi-conducting portions of the original semi-conducting material from each other. In another form, oxidation or anodization is effected to only partially insulate or isolate portions of the semi-conducting material from each other.

4 Claims, 15 Drawing Figures

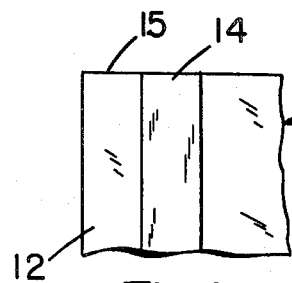
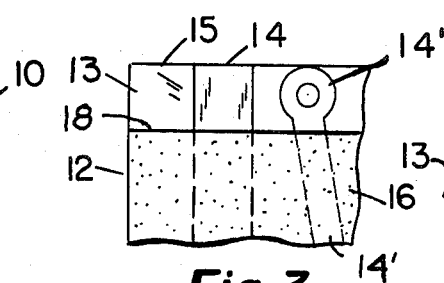
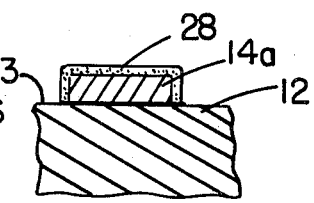
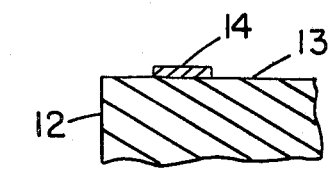
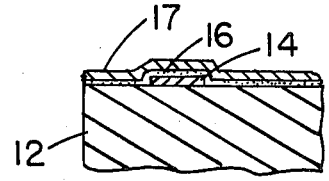
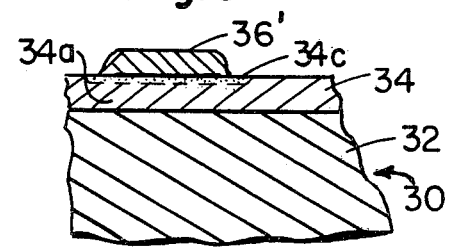
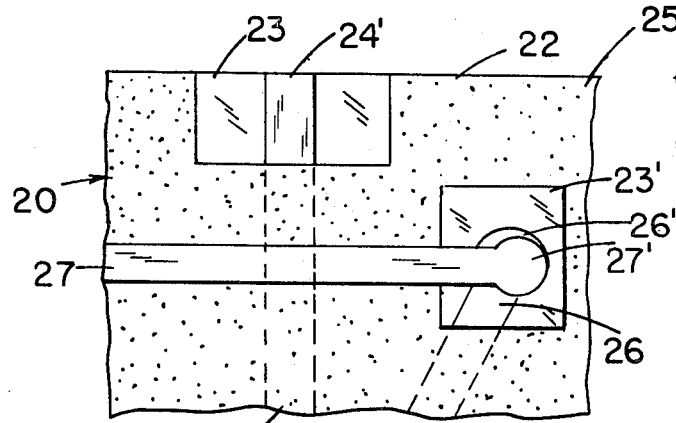
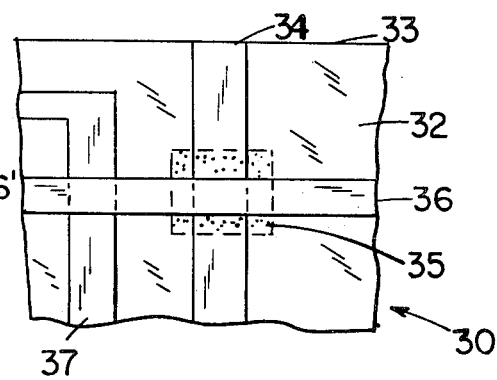
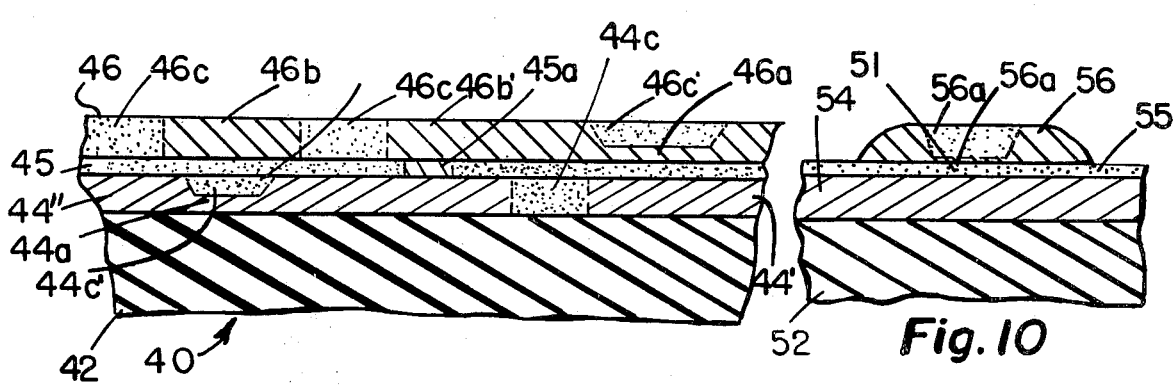
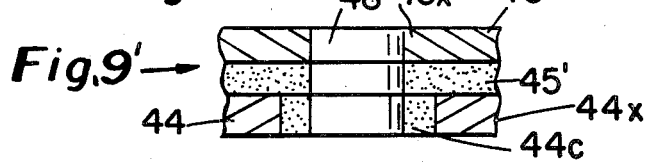

ELECTRICAL DEVICE OF SEMI-CONDUCTING MATERIAL WITH NON-CONDUCTING AREAS

RELATED APPLICATIONS

This is a continuation of application Ser. No. 660,800 filed Feb. 24, 1976, for Method of Fabricating an Electrical Device, now abandoned which a continuation-in-part of Ser. No. 294,837 now abandoned filed Oct. 4, 1972, as a continuation of Ser. No. 849,012 filed Aug. 11, 1969, now abandoned, which is a continuation-in-part of Ser. No. 442,875 filed Nov. 24, 1964, now U.S. Pat. No. 3,461,347 which is a continuation of Ser. No. 86,838 filed Dec. 27, 1960, now U.S. Pat. No. 3,169,892.

SUMMARY OF THE INVENTION

This invention relates to new and improved structures in electrical components and circuits containing one or more portions thereof which define semi-conducting circuit components. In particular, the invention is directed to electric circuit structures in which one or more portions of a semi-conducting material are rendered either non-conducting by the selective oxidation thereof or of substantially reduced conductivity below that of the semi-conducting material which is not so rendered. In particular, the instant invention defines new and improved switching devices and circuits formed at least in part of semi-conducting materials and oxides or non-conducting materials which are formed of the semi-conducting materials in situ on the semi-conducting material or the substrate supporting same. The oxide portion or portions of the semi-conducting material may serve to isolate selected portions of semi-conducting material or to vary the conducting characteristics of material disposed between separated portions of the semi-conducting material.

Accordingly, it is a primary object of this invention to provide a new and improved electrical device or structure formed at least in part of semi-conducting material.

Another object is to provide a new and improved structure in a semi-conductor for use in electrical circuits.

Another object is to provide an electrical device which may be easily formed of semi-conducting material, one or more portions of which are converted to either non-conducting material or material of substantially reduced conductivity.

With the above and such other objects in view as may hereinafter more fully appear, the invention consists of the novel structures and arrangements of components of electrical devices or circuits which will be hereafter more fully described and illustrated in the accompanying drawings, but it is to be understood that changes, variations and modifications may be resorted to which fall within the scope of the invention as claimed.

In the drawings:

FIG. 1 is a fragmentary view taken from above a circuit member prior to the further fabrication thereof;

FIG. 2 is an end cross-sectional view of a fragment of FIG. 1;

FIG. 3 shows the circuit member of FIG. 1 processed with an insulating layer which has been formed from a layer of metal or semi-conducting material;

FIG. 4 is a cross-sectional view of FIG. 3;

FIG. 5 is a plan view of a circuit board showing further details of a structure applicable to electrical circuits;

FIG. 6 is a cross-section of part of a circuit element formed on a base which element has been insulated in situ thereon;

FIG. 7 shows another circuit structure in plan view;

FIG. 8 is a cross-sectional view of another structure of a circuit element and an insulating portion thereof;

FIG. 9 is an end cross-sectional view of a circuit board showing multiple layers of conductors which are dielectrically separated from each other;

Figure 11:
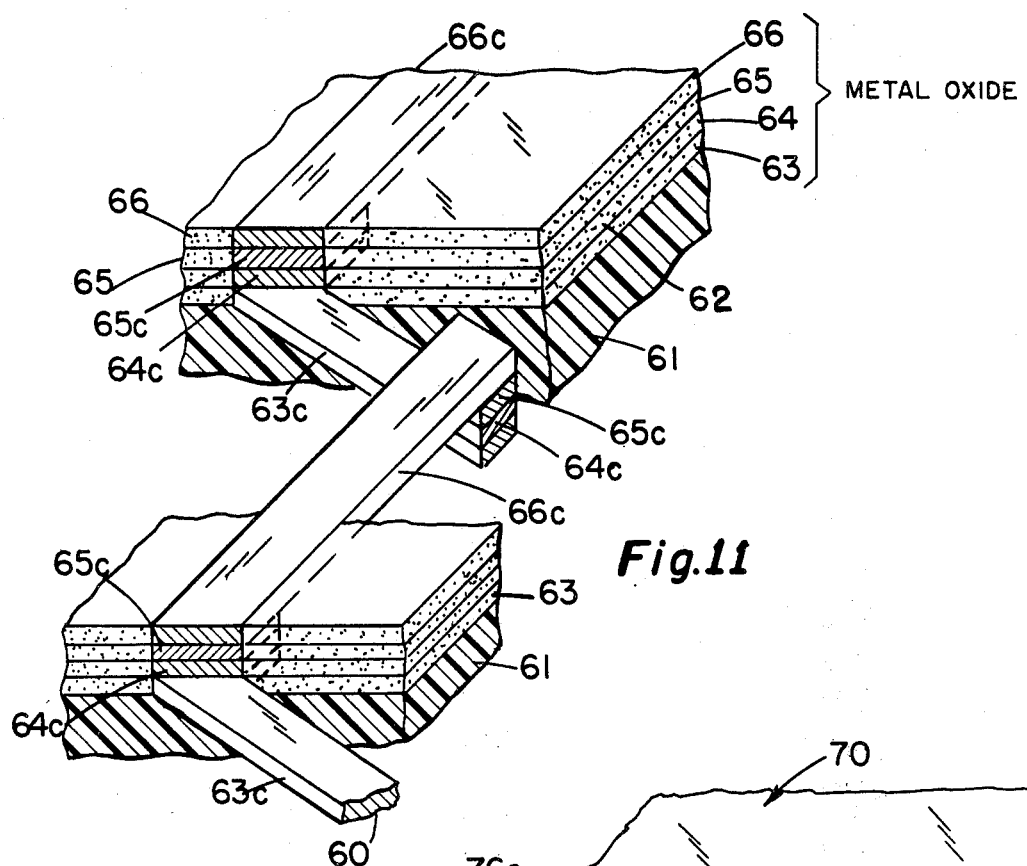
Figure 12:
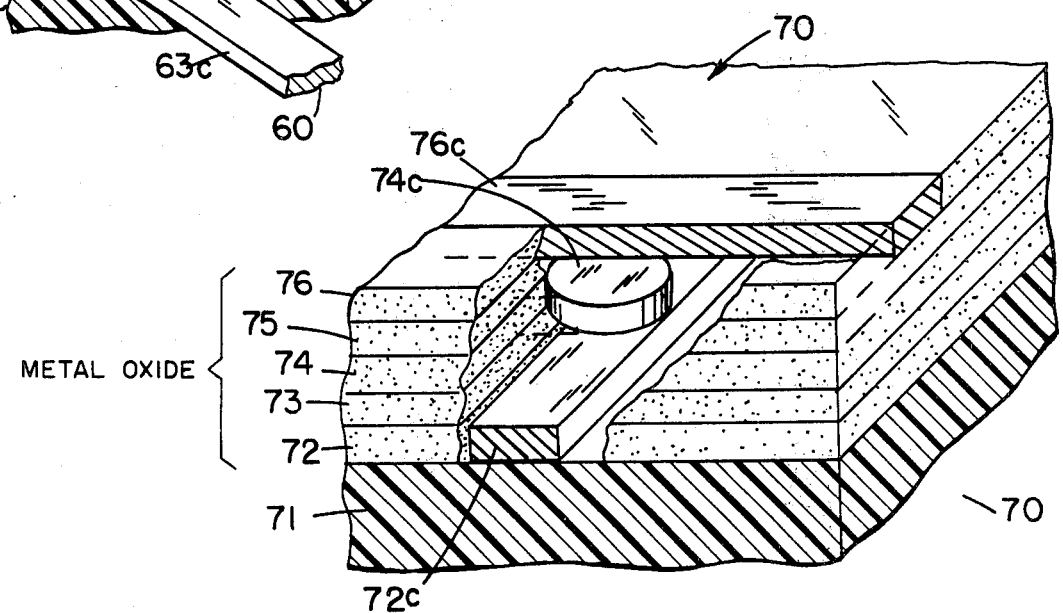

FIG. 9' shows a further circuit structure in cross section applicable to the other structure illustrated;

FIG. 10 shows a structure and a conductor in cross section which conductor has been partly converted to a dielectric material;

FIG. 11 shows how the multiple layer fabrication techniques of the instant invention may be utilized to form another conductor;

FIG. 12 shows the formation of a switching matrix in accordance with the instant invention.

Figure 13:
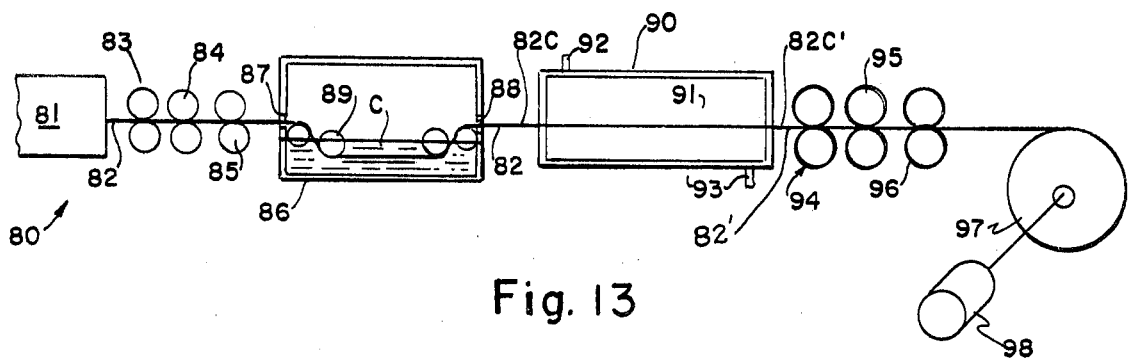
Figure 14:
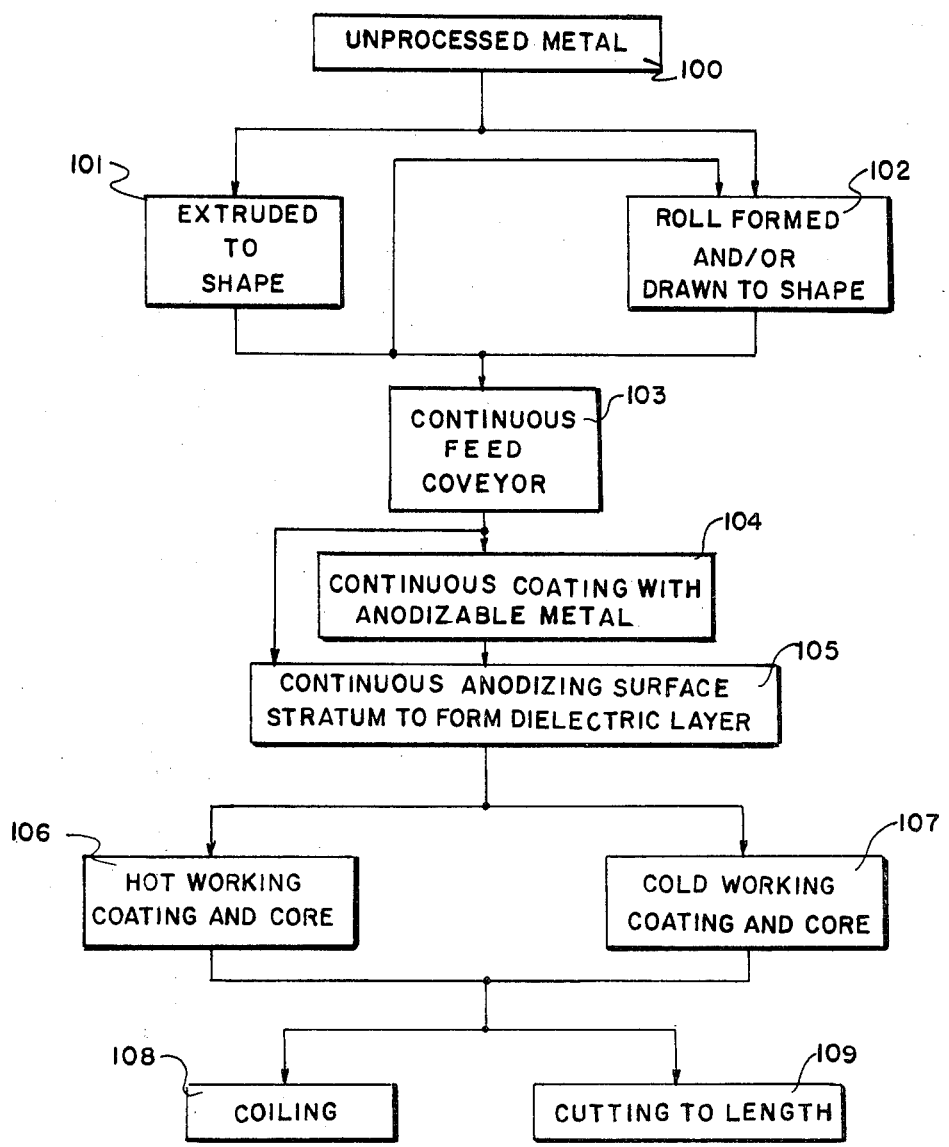

FIG. 13 is a schematic diagram of an apparatus for producing elongated electrical wires and the like having a surface layer or coating of a non-conducting metal oxide produced by the techniques herein defined and FIG. 14 defines the steps involved in processing a wire by the apparatus of FIG. 13.

It is known in the art to produce an electrical circuit or circuit element by disposing a metal sheet or film on a substrate and chemically removing or etching areas thereof to leave circuit connecting elements in place. The general term "printed circuit" has been applied not only to circuits which are printed or silk screened on a base but also to electrical circuits formed by etching. Metal sheet or foil in the order of several thousands of an inch thick or greater is generally bonded to an insulating substrate and employed for the conducting components of such circuits. However, conventional printed circuits of the above type of a number of shortcomings including the fact that components subsequently added to the circuit generally extend well beyond the plane of the surface of the instrumental components thus preventing the use of the technique to produce multi-layer electrical circuits without difficulty. Furthermore, in the manufacture of such circuits, it is generally necessary to apply dielectric materials as coatings to insulate the circuit element, not to mention the effort required in attaching circuit elements to the printed circuit board.

Accordingly, the instant invention resides in the fabrication of electrical circuits by applying thin or thick films to a substrate and selectively oxidizing portions thereof not only to define interconnecting circuit elements but also to provide circuit components such as resistors, capacitors, and new and improved types of inductors. Means are also provided herein for forming switching matrixes by selectively converting portions of metal film to a non-conducting oxide and selectively providing switching elements between crossing circuit elements. Such switching elements may be separately fabricated units which are selectively secured to the substrate and the circuit elements deposited thereon or may comprise deposited material which is selectively applied to the substrate across or between respective conductive elements.

FIGS. 1 and 2 illustrate a portion of an electrical circuit member such as a circuit board or other component consisting of an assembly 10 of a base 12 which is preferably made of insulating material and which has an electrical circuit member 14 bonded or otherwise secured to its upper surface 13 and illustrated as shaped in a thin strip, layer or film of electrically conducting metal. It is assumed that the circuit conductor 14 terminates at or near an edge 15 of the base or board 12 at which end it may be electrically connected to another circuit or an electrical device. The element 14 may have any suitable thickness varying from that of a thin film in the order of microns in thickness or less to that of a strip of metal applied directly to surface 13 per se or formed thereon after etching a larger sheet or coating of metal bonded to 13. In other words, the conducting circuit element 14 may be applied as a sheet of metal to 12, electro-deposited on the upper surface 13 of 12 by various known techniques, or metallized or vacuum coated on 13 either in the shape illustrated or as a uniformly distributed layer which is thereafter shaped by a mechanical or chemical action.

In FIGS. 3 and 4 a coating or film 16 of metal has been applied by vacuum depositing from the vapor state or electrodeposition of said metal completely over substantially all of the exposed surface of said film or strip 14 and preferably over most of the adjacent surface 13 of 12. The entire layer or film 16 is thereafter completely converted to a non-conducting or dielectric material so that it forms an insulating coating for the conductor 14. The notation 18 refers to a line defining the edge of a mask which is placed adjacent the edge 15 of the circuit board 12 either prior to the application of the conducting layer 16 thereto or prior to the application of the material or atmosphere which converts 16 to a dielectric material so that the end portion 14' or 14 is either exposed or consists entirely of an electrically conducting material and may therefore be electrically connected to another component or circuit by soldering, welding or fastening means.

The base 12 may consist of any suitable rigid or flexible insulating material such as thermo-setting plastic, glass, plastic-glass laminates or the like. It may also comprise a sheet of metal the upper surface of which is coated with or converted to an insulating layer on which 14 is deposited or secured. The conductor 14 may consist of any suitable conducting metal. The metal applied as layer 16 may also comprise any suitable metal which may be entirely converted thereafter to a non-conducting compound of said metal. For example, 16 may at first comprise a coating or film of aluminum which is vacuum or electro deposited on 14 and 12. It may thereafter completely be oxidized by exposure to a suitable atmosphere to form a dielectric coating. If the layer comprising 16 is thin enough, it will convert to aluminum oxide in air at room temperature. The process may be hastened for heavier layers of aluminum such as sheet by applying oxidizing gases or vapors thereto. For example, if the coating or film 16 is heated in the range 300 to 600 degrees centigrade and is exposed to an atmosphere of hydrogen fluoride or is exposed to elemental fluorine, the resulting reaction, if sustained long enough, may be used to convert the entire layer 16 to the metal flouride compound. A coating of said fluoride in the order of 1 to 2 microns in thickness will exhibit a resistance value in the order of $10^{10}$ or more ohms. Depending on the thickness of layer 16, it may be necessary to sustain the reaction for a period of time in which a small portion of the outer layer of conducting element 14 is also reacted on by said oxidizing atmosphere or material and is converted to a dielectric compound to guarantee complete conversion of all the metal of layer 16.

The notation 14' in FIG. 3 refers to a second conducting strip on 12, the end of which is shaped with an eye 14" which is exposed for connection thereto.

In FIG. 5 is illustrated a portion of an electrical device 20 which is fabricated in accordance with the teachings and the technique of FIGS. 1 to 4 and in which a further conducting element is applied to the base. The insulating base 22 may be any suitable shape and is illustrated as a flat sheet or plate. Applied first thereto as described, is a thin strip of conducting material referred to by the notation 24. Applied over that surface of 22 against which 24 is applied, is a coating or film of metal 25 which is entirely converted to a dielectric coating or film as described. The notation 23 refers to a portion of the surface of 22 containing thereon element 24 which does not contain the dielectric covering 25 and is thereby accessible for connection to another circuit device or element. A second circuit element 26 which may also be an extension of 24, extends beneath the dielectric covering 25 against the upper surface of base 22. A second area 23' of the surface of 22 on which the end 26' of 26 extends, is also void of the material of the insulating layer 25. Extending across the upper surface of 25 is a third circuit element 27 which may be applied as a thin strip, coating or film of metal thereto. The strip 27 crosses strip 24 and is insulated therefrom by the layer 25 of dielectric material. The end 27' of 27 is shown as extending across the area 23' and is in surface contact with the end 26' of 26. The element 27 may be applied to 25, 23' and 26' by any of the techniques described for the application of 14 to 12 including vacuum deposition, electro deposition or plating, spraying, or adhesively bonding to 25 with the end 27' thereof welded or soldered to 26'. The structures illustrated in FIG. 5 are applicable to the fabrication of various improved circuit elements and circuits in which a high density of components per unit volume is desired. It can easily be seen that if the circuit elements 24, 26, 27, etc., are applied as thin layers or films and the insulating layer or layers 25 are applied therebetween as thin layers or films, a substantial number of circuits may be constructed as a multiple layer unit with each circuit element or group of elements in one layer separated from those of the next layer as well as from each other by respective layers of deposited metal which has been completely converted to an oxide or other dielectric compound as described.

In another form of the invention it is noted that in constructing a multi-layer circuit element of the types illustrated in FIGS. 1 to 5, one or more of the metal coatings such as 25 may be only partly converted to the oxide or dielectric compound of said metal with remaining portions serving as further circuit elements. Said partial conversion of the dielectric material may be effected by masking those areas of the film or coating to prevent their exposure to the oxidizing atmosphere or chemical, which masking may comprise a removable stencil or may be a coating of a dielectric material applied permanently thereto or stripped therefrom thereafter.

Various modifications in the structures illustrated in FIG. 5 are possible and may include the provision of additional layers of dielectric material and circuit conducting elements over those shown, the securing of separate circuit components to exposed areas of the circuit components such as the end 24' of 24 and 26', which components may be integrally bonded to the base and may also be coated with a dielectric material as described or masked to prevent said coating. Various electrical components such as capacitors, diodes, semiconductors, resistors and the like may also be applied to 20 and electrically connected to one or more exposed portions of circuit elements deposited or otherwise secured thereto by means of vacuum or electro deposition, spraying or other known techniques for the construction of more elaborate circuits. A mask or masking means may be applied to define the areas of these materials which are deposited on the exposed surface of the base 20, conducting element 27 or dielectric layer 25. In other words, the circuit elements may be formed by selective deposition on the base material, the dielectric layer may be formed by the selective deposition of a metal and/or the selective conversion of all or parts of said metal to an oxide or dielectric compound thereof and the subsequent circuit elements may also be formed by the selective deposition of a metal on the resulting upper surface.

FIG. 6 illustrates a modified form of the embodiment presented in FIGS. 1 to 4 in which only the exposed surface of the circuit element 14a which is bonded to the upper surface 13 of base 12 is coated with an oxide or dielectric layer 28. The layer 28 may be formed by exposing the element 14a to an oxidizing atmosphere or liquid and converting part of it to the oxide of said metal forming layer 28. The outer surface of 14a may also be coated with a film or layer of a metal such as that comprising 16 which may thereafter be converted to its dielectric compound as described. The exposed surface of strip 14a itself may also be converted to the dielectric compound of the metal by treatment with an oxidizing chemical. In other words, the layer 28 of oxidizing material may be made by conversion of the surface layer of said element.

In FIG. 7 is shown a further structure in an electric circuit member or circuit board made in accordance with the teachings of the invention. The assembly 30 comprises a base member such as an insulated sheet or board having a first circuit element 34 in the form of a strip, coating or film deposited or adhesively bonded thereto. A second conductor 36 in the form of a thin, flat strip or film of metal extends lateral to 34 and crosses thereover. The notation 35 refers to an insulating layer of limited area disposed between 34 and 36 in the area of cross-over. The patch 35 may be formed by vacuum or electro-depositing a metal through a mask or stencil after the formation or securing of 34 to 32, directly over that length of 34 across which 36 will pass. Thereafter the patch of metal film or coating 35 is converted, at least in part, to the oxide or dielectric compound of the metal over which strip 36 is deposited or adhesively secured. The notation 37 refers to another conducting strip of metal which has been deposited with strip 34 and is shown electrically connected to 36 which is deposited directly thereon.

FIG. 8 shows a cross-over structure for two circuit elements on the surface of a base 32. The circuit element 34 adjacent 32 is provided of sufficient thickness to permit part of the upper portion or surface layer 34c thereof to be converted to a dielectric oxide layer for a length sufficient for a second circuit element 36' to be deposited or otherwise secured to the upper surface of said strip and to be insulated from the conducting portion thereof. The notation 34a refers to the remaining, lower portion of that segment of 34 which is still conducting. If it is desired to retain the cross-section of the portion 34a of 34 equal to that of the cross-section of the rest of the strip so that the resistance thereof will not be greater than that of the rest of the strip, the strip may be provided of increased width along the length thereof defined by portion 34a.

FIG. 9 illustrates additional structures in printed circuit boards and the like provided in accordance with the teachings of this invention. The circuit board or assembly 40 consists of an insulated base 42 on which a first circuit element or elements 44 is deposited or otherwise provided as described. The notation 44c refers to a section of 44 which has been completely converted to an oxide or other compound rendering it a dielectric which devides 44 into two segments, 44' and 44''. The conversion of 44c to said oxide of said metal may be effected by masking the remaining surface of 44 and applying an oxidizing atmosphere to the outer surface of 44c for a sufficient time to permit complete conversion of said metal. If 44 is applied as a film or layer coating all or a substantial portion of the upper surface 43 of 42, a circuit in the form of element 44 and others may thus be formed thereof by converting the areas between what will eventually be the conducting elements to the dielectric compound of the metal layer or film from which 44 is formed.

To one side of 44c, a portion of 44'' has been partly converted to dielectric material by masking the remainder of the element and exposing the surface of a segment 44c' to a dielectric forming chemical or atmosphere for sufficient time to convert a predetermined thickness thereof to a non-conductor or semi-conductor. The remaining portion 44b of 44'' is of substantially less thickness than the rest of 44'' and if the strip is of substantially constant thickness, portion 44b will have a higher resistance and may be used as a resistor in the circuit defined in part by 44''.

Deposited over 44 is a layer or film of metal which has been converted as described to a dielectric material with the exception of areas such as 45a thereof which have been masked from the oxidizing atmosphere and may be electrically connected to either or both the lower conductor and an upper conductor 46 which has been deposited or otherwise applied thereover. In other words, the dielectric layer 45 may also be used as part of the circuit.

If all layers of a circuit member such as 40 are deposited by vacuum or electrodeposition and circuits are formed thereof as provided in FIG. 9 by conversion of certain areas of each layer to a dielectric material as described without substantially reducing or increasing the thickness of each layer, then, it is noted that each circuit element or conductor will remain in its particular layer and will not extend out of said layer in order to conform to a changing upper surface of the type which results from the selective deposition of conducting circuit elements and components. The significance of such fabrication method is that any number of circuit layers may be stacked one on the other without eventually resulting in a formation with a highly irregular surface on which it is difficult to add or deposit circuit components due to the contour thereof. By the structure and method of FIG. 9 the circuits and components of one layer may be electrically connected to those of the next layer above or below which it is insulated from by the intermediate layer of dielectric material 45 by not converting a portion of said intermediate layer which is in alignment with the circuit elements to be connected. For example, the portion 45a of intermediate layer 45 is retained as a metal by masking it so that it is not converted to the oxide when the upper or outer surface thereof is exposed to said oxidizing atmosphere. Conducting portion 45a therefore electrically connects strip portion 46b' with portion 44" in the lower conducting layer 44. If it is desired to deposit or secure other circuit elements or conducting or semi-conducting materials for connection to circuit elements in any particular layer, a mask may be used for the etching of selected areas of the layer or layers therebeneath so that material may be deposited in the resulting cavity or secured therein and may be retained below the surface of the layer. By completely filling the cavity with material, an uninterrupted surface may be presented for the next layer to be deposited on.

Illustrated in FIG. 9' is a further circuit construction which may be applied to a circuit member such as 40. Shown are three deposited layers of conducting and non-conducting material. The lower layer 44x may be part of a further circuit stack or may be directly secured to a base such as 42 of FIG. 9. An intermediate dielectric layer 45' covers the conducting strip 44 and the non-conducting portion of its layer. A third layer 46x of conducting and non-conducting material is deposited on layer 45' and formed into a circuit as described. The notation 48 refers to a cavity or hole provided through two or more of the layers which cavity may be provided by mechanical or electrical drilling, milling or etching. The hole passes through a conductor 46c in the upper layer 46x, through the insulating layer 45' and through an insulating portion 44c of the lowest illustrated layer 44. A semi-conducting material may be filled or deposited by any known means in the multi-layer hole or cavity thus provided which material may form a component of substantial thickness as compared to the thickness of one of the layers. The resulting component may be electrically connected to one or more circuit elements of the upper layer by contact therewith and may completely fill the cavity or be surrounded with a potting compound to fill out the remainder of said cavity so as to provide an upper surface which is flat. Contact of the lower end of the component with a conductor in a lower strata or layer may be used to effect electrical connection therewith, whereupon that portion of the cavity or hole would be made through a conducting portion of the layer. Partly filling the hole with a conducting material such as a liquid metal or a deposited metal will assure electrical connection of the lower portion of the component with the conductor of the lower level. Electrodeposition may be employed to provide said connecting material in the hole for connecting the component placed or deposited in the hole with the conductor of the lower layer by exposing the cavity with the component therein and partly filling said cavity to the flow of vacuum or electrodeposited material.

Subsequently deposited layers of conducting material such as layer or strip 46 applied above the dielectric layer 45 may be etched or partly converted to dielectric material for the formation of circuits and circuit components such as the described resistor portions. Capacitance circuits may also be provided where two or more layers or strips of conducting material cross each other and are separated by a thin dielectric layer of the type described. A unique capacitive-resistance circuit construction is illustrated in FIG. 10. The assembly comprises at least in part, a first conducting layer or strip 54 deposited or otherwise secured to a circuit board or base 52, over at least part of which is provided a thin dielectric layer 55. A second strip of metal 56 extends oblique or normal to 54 across 55. A portion 56c of 56 has been converted to dielectric material by masking and exposure, as described, to an oxidizing atmosphere for a predetermined time period, leaving a portion 56a of 56 in the area of cross-over. The junction 51 or cross-over area thus provides a resistance in the circuit comprising element 56 and a capacitance between 56 and 54.

Whereas the dielectric portion 56c is shown in FIG. 10 as extending only partly across the width of the strip 56, the entire width of strip 56 may be converted to the dielectric oxide compound in the manner that strip 46a of FIG. 9 is converted by exposure of the entire width thereof to said oxidizing atmosphere. The remaining conducting portion 56a may have any desired thickness from that in the order of microns or less to several thousandths of an inch depending on the characteristics desired of the resistor and the conducting layer portion. In other words, the structure of FIG. 10 may be used to provide film resistors which are an integral part of a conductor of substantially greater thickness.

As heretofore stated, dielectric coatings may be provided of coatings or films of metal deposited by vacuum deposition means on circuit members by oxidizing the film by exposure to an oxidizing atmosphere. Thin films of aluminum may be converted to aluminum oxide, a dielectric, by exposure to oxygen such as that present in air. To hasten the process, the part and/or the atmosphere may be heated. Fluoride coatings of the metal such as that obtained when aluminum is exposed to hydrogen fluoride, may also be provided and result in an effective dielectric coating for the conductor(s) of the circuit devices.

The following procedure for providing a dielectric coating on an article of manufacture is noted which will reduce the time required for processing the article and provide a coating of superior quality. The article is first heated either prior to or after its admission to a vacuum chamber, to a predetermined temperature. The article is mounted or otherwise made an electrode of the vacuum metallizing system or positioned whereby it will receive the vapor of the metal which is thereafter vapor deposited thereon. Portions of the surface of the article may be masked to prevent deposition on the surfaces thereof. Either during the vacuum deposition process while the metal is being deposited on the article or immediately thereafter, a predetermined quantity of the oxidizing material, such as hydrogen fluoride, is introduced into the chamber preferably adjacent the surface which is coated or is being coated. As a result, reaction takes place immediately while the article is at elevated temperature in the vacuum chamber. Noted advantages of this process include: (a) An improved bond of the vaporized metal to the article is effected due to the heating of the vaporized layer and the resulting effect on the physical state thereof. A molecular bond or welding of the vacuum deposited layer of metal is effected if the surface temperature of the article is in the range of 600° C. for aluminum. (b) The conversion to the oxide or fluoride dielectric compound of the metal occurs more rapidly since the coating metal is at elevated temperature. (c) The need for reheating and rehandling the article is eliminated and cycle time is reduced. The article to be coated, may be heated while in the vacuum chamber after the normal atmosphere or air has been removed therefrom, by induction heating means or other means thereby reducing or eliminating surface oxidation resulting from exposure to the air remperature and providing a vacuum coating of known composition on a surface of known composition. In other words, the quality of the coating as well as that of the surface on which it is deposited is known and may be retained without the introduction of impurities by heating the article in the vacuum chamber or in a chamber having a known atmosphere of vaporizing metal and/or oxidizing composition or atmosphere. By employing apparatus which introduces the vaporized metal and an oxidizing vapor or gas such as hydrogen fluoride simultaneously against the surface of the base or circuit board said metal may actually reach the surface of the board in a partially or completely converted or oxidized state.

Other forms of the invention are noted as follows:

The gaseous anodization techniques described may be used for oxidizing thin metal films to form dielectric materials including a variety of different metals, alloys and metal compounds deposited as films, plated, sprayed or otherwise applied to a base and/or each other for use in the fabrication of both active and passive electronic circuit elements. Semi-conductors may also be formed by the described techniques. In particular, the technique illustrated in FIG. 10 may be used to form tunneling barriers and other portions of semi-conductor devices of relatively thin cross section. Integrated microelectronic circuits may also be similarly fabricated by selectively exposing selected areas of conducting and/or semi-conducting material or materials deposited as layers or films on a substrate and, in certain instances, on each other to oxidizing atmospheres.

Heating to predetermined temperatures and/or etching of selected areas of films deposited as described while exposed to an oxidizing atmosphere may be effected for causing predetermined changes in composition of the device or layer may be effected by an intense electron beam or intense coherent light beam or beams such as generated by a laser which are either directed along a fixed path while the substrate is moved or are deflection controlled to scan selected areas of the deposited material. The beam or beams may be operative to heat the selected area or areas to a temperature whereby the oxidizing atmosphere converts the heated area to dielectric material while the surrounding areas which are not so heated, are not so affected.

The oxidizing atmosphere may be replaced by an etchant such as a vapor of an acid operative to perform material conversion or etching of those areas exposed through a mask or selectively heat as described while the surrounding areas are not so heated. Semi-conducting materials such as compounds of germanium, silicon, tantalum and others may be selectively oxidized as described to form tunneling barriers, collector domains, electron sinks and integral electronic devises.

Selective introduction of certain impurities in the oxidizing atmosphere and/or electron beam may also be used to dope the film as it is anodized to provide various electronic devices.

By employing fabrication techniques as herein described a flat, helical conductor 60 which may be used as an electrical inductance may be fabricated in a variety of shapes, one of which is illustrated in FIG. 11 in which the device is formed by depositing a plurality of layers 62 of conducting metal on a substrate 61 and converting predetermined through and through portions of each layer to a dielectric material by exposure to an oxidizing atmosphere. The metal film deposited as a first layer 63 on substrate 61 is converted to a dielectric compound of the metal save for a plurality of diagonal strip portions 63c of the metal which are spaced apart and extend substantially parallel to each other. A next metallic layer 64 is deposited on the converted layer 63 over the strip portions 63c and is converted to dielectric material save for small area portions 64c aligned with portions 63c at the ends thereof. A plurality of layers of metal represented by the single layer 65 may be thereafter deposited and selectively converted to dielectric material to build up the helix in which conducting portions such as 65c overlying portions 64c remain of the entire layers after selective oxidation thereof. The uppermost layer 66 of the plurality of layers 62 is converted to the dielectric compound of the metal save for strip portions 66c which overlie the portions 65c and connect the ends of strip portions 63c through the remaining metallic interlayer elements 64c, 65c, etc. A helical conductor is thus provided and includes elements 63c, 64c, 65c and 66c of the multiple layers which may be used as an inductor. The layers 63 to 66 may contain many more layers therebetween which layers may also have other conducting elements formed or deposited therein as part of the same circuit containing said helical conductor or parts of different circuits. Formation of layer conducting elements 63c, 64c, 65c, etc. is effected by the application of masks over the areas of each metal layer where the element is to remain while exposing adjacent areas to an oxidizing atmosphere or selectively depositing metal in said areas and dielectric film onto adjacent areas. Conductors 63c, 64c, 65c and 66c forming the helical conductor 60 may also be selectively formed by selective plating or the selective vacuum deposition of said elements with the surrounding volume being filled with dielectric material by any suitable means; strip formations 63c and 66c may also be curved or shaped other than as straight strips or bars to vary the shape of the indicator or coil 60.

The technique of masking and oxidizing only selected through and through areas of conducting films or coatings to provide conductors or circuit elements in the remaining areas may also be used to fabricate switching matrices as follows:

(a) First mask a conducting surface such as a sheet of glass and sputter or otherwise vacuum deposit components as magnetic film materials on selected areas thereof which become thin film switching elements.

(b) Next mask over the magnetic materials and sputter or otherwise vacuum deposit a second conducting metal on remaining areas.

(c) Next mask part of the second metal and convert areas therebetween to dielectric compound of the metal by exposure to an oxidizing atmosphere leaving conducting elements or strips connecting the components or overlying the components.

(d) Layers of such components and/or conductors may be formed one on the other to provide switching matrices, circuits, etc.

FIG. 12 illustrates part of a switching matrix 70 formed by the selective oxidation of alternate layers of metal vapor deposited on a non-conducting base 71. A first layer 72 is deposited on 71 and oxidized save for a strip or plurality of paralleled strip portions 72c thereof. A second layer 73 of metal is sprayed or vacuum deposited on the upper surface of layer 72 and completely oxidized. A third layer 74 is deposited on 73 except in a plurality of volumes of cylindrical or other shape in which are deposited magnetic material such as nickel or other ferro-magnetic alloys which define electronic components, memory devices or cores 74c operative to generate magnetic fields which are oriented in accordance with signals generated in conductors 72c and 76c. Such structure is effected by deposition procedures involving masking. A fourth layer 75 is deposited on top of 74 and is completely oxidized to form a dielectric layer. A fifth layer 76 is deposited on top of 75 and is oxidized with the exception or parallel strip areas 76c which remain as conducting metal, strip areas so aligned that 72c and 76c cross each other in alignment with component 74c. A current passing through either conductor will thus affect magnetization of 74c. The ends of conductor elements 72c, 74c are electrically connected to computer input switching means.

Means other than the hereinbefore described technique of vacuum deposition of metal film and conversion of portions thereof to oxide film may be employed to fabricate devices of the type illustrated in FIG. 12. Techniques involving the selective area deposition of metallic films, semi-conducting and insulating materials by solution deposition or plating, sputtering or electron beam deposition means may be employed to supplement or replace the hereinbefore described fabrication means. With respect to the latter means, it is noted that metals, non-metal and semi-conducting materials may be selectively introduced in predetermined quantities into an electron beam, vaporized and carried thereby in an ionized state to selected areas of the surface of the work-piece or substrate for the selective deposition thereon to form circuits, circuit elements and switching matrices as hereinbefore described.

The hereinbefore described procedures for fabricating electrical circuits and circuit elements by partially anodizing or oxidizing metal coatings or films applied to a substrate or other coatings, may be utilized for the fabrication of insulated electrical conductors such as elongated strips and wires of metal as well as single or multiple layer cables made of a plurality of thin strip conductors formed by metallizing a sheet of insulating material such as a polymer or insulated metal sheet with a thin film of metal and oxidizing or anodizing selected spaced apart parallel strip areas of the film to electrically isolate the remaining parallel conducting strip areas of metal film. The following procedures are herein presented as forming a part of the current invention:

I. In a first method, an elongated member made of aluminum or aluminum alloy is formed and provided as a wire, strip or other shape the exterior surface of which is either coated with high purity aluminum and anodized or oxidized or is directly anodized or oxidized as it is formed by drawing, rolling or extruding the member to shape. The coating or anodized surface layer is thereafter exposed to said oxidizing carriers of fluorine or the like to provide a fluoride dielectric film on the exterior surface of the wire or strip. Cold working by drawing or reverse rolling the conductor may be applied either prior to or after providing the dielectric film providing an improved wire type conductor and insulation means therefore since the anodized layer improves the strength of the structure while the dielectric film provides an insulating layer which is superior to the anodized coating alone. If cold worked prior to the application of the fluoride atmosphere, the anodized layer or coating may provide a hard, non-porous sheaving or coating on the aluminum conductor base or coating thereon which coating also improves the adhesion between the dielectric insulation formed thereafterr and the wire. The same procedure may be applied to shapes other than wires of constant cross section or parallel strips such as circuit elements, connectors, etc. Such a procedure may offer a substantial improvement over the procedure involving conversion of the surface layer or a film coated thereon to dielectric film or oxide film without previously anodizing and cold working the anodized layer due to improvements in the bond and hardness of the subsurface structure defined by the anodized layer.

The first method may also be modified whereby the base shape or wire may comprise copper or any suitable metal which is coated with aluminum which is partly or entirely anodized prior to the conversion of the surface layer thereof to a fluoride dielectric film or coating.

Strip conductors or wires made of multiples layers of conducting metal electro deposited or vaporized on layers of dielectric film (with or without intermediate anodizing and cold working) may be formed as described, on a continuous basis by completely or partially converting each layer to a dielectric film as described with interposed layers or strip portions thereof remaining unconverted to serve as conducting elements.

II. In a second method, a conductor such as a wire, strip or strips of copper, aluminum or alloys thereof is moved through an opening or openings in a wall of a chamber from a supply thereof such as an extruder of said metal or drawing mill, in which chamber an oxidizing carrier of fluorine such as hydrogen fluoride or elemental fluorine is continuously introduced and caused to flow against the wire or wires after heating said wire by induction or electron or laser radiation beams means to raise its temperature in the range of 300 to 600 degress centegrade. The conductor is maintained as it travels in said chamber in said oxidizing atmosphere until a dielectric film of fluoride of a desired thickness has formed on the aluminum surface or coating on the base whereafter it is continuously fed through a cooling zone in said chamber. A further opening in a wall of the chamber, which like the first opening, sealingly receives the wire which passes therefrom to a coiling or further processing apparatus.

III. Fluoride dielectrics of the type hereinbefore described may be utilized for insulating and protecting articles such as wire, fasteners, clips or other devices having the major portion thereof made of a ferrous metal such as steel. As the fluoride dielectrics are formed on the base metals at temperatures in the range of 300–600 degrees centigrade (500–1100 degress Fahrenheit) and, since many steels may be tempered and hardened in this range and the fluoride dielectric forms to a suitable thickness in about the time it requires to form such steel transformations as martensite pearlite and spherodite, a process is herein proposed which includes the simultaneous formation of such steel transformations and the provision of a fluoride dielectric coating as described. The procedure may include heating the ferrous metal alloy base and processing the surface thereof to suitably receive an aluminum coating, coating with aluminum or other suitable metal, maintaining or varying the temperature thereof to provide it at the desired degree to form the dielectric coating and tempering or hardening the base metal, converting all or part of the coated metal to said dielectric, fluoride insulating compound and either slowly or rapidly cooling the article and coating thereafter to provide the base metal in the desired grain structure. Slow cooling will result in a pearlite structure whereas fast cooling attained, for example by quenching, will result in the martensite or spherodite structure depending on the temperature at which cooling is started and the rate of cooling.

Steel wire or cable may be continuously processed as hereinbefore described by the continuous coating thereof with aluminum and conversion of all or part of the coating to the fluoride dielectric compound of the aluminum.

As both the coating and flouride film techniques require substantially clean, scale-free surfaces, it is proposed to eliminate the need to clean and initially heat the metal in the processing of elongated shapes such as wire by extruding or hot rolling said metal wire from either the liquid or semi-molten condition directly into the chamber containing the oxidizing character of fluoride so as to prevent the introduction of other impurities into the surface being coated and so treated. The procedure may include working the base metal and/or coating thereon prior to or after cooling so as to improve the strength and surface characteristics thereof by rolling, bending or the like. Rapid cooling may be effected of the elongated shape after it is coated so as to form a crystaline structure of the base portion thereof having desired characteristics as described.

In a still further improvement in the hereinabove provided procedures for fabricating and protecting metal by anodizing the surface thereof or a coating of anodized material deposited on the surface of the article, said anodized coating or layer may be further improved by cold and/or hot working same. Where the metal is continuously formed and fed as described, the working of the anodized layer may be performed also on a continuous basis. Such working may be effected by passing the shape through rolls and/or other means, including sizing in a die, shot peening, ultrasonic vibrations applied to the dies or rolls, etc. Heating by means of induction heating the core metal, dies, rolls etc. may also be probided to treat said anodized layer and improve its characteristics or bond.

FIG. 13 shows an apparatus for effecting the described process for continuously processing shapes such as wires, rods and buses or other structural members to render insulating and wear resistent coatings on their surfaces. The apparatus 80 includes an extruder 81 or continuous casting machine for continuously forming a first shape 82 of metal which may be fed thereafter directly to a rolling mill 83 containing sets of upper and lower rollers denoted 84 and 85 which are power driven to perform either or both the functions of working the member 82 and more precisely predetermining its shape. From mill 83 the shape 82 is fed to a tank 86 through an opening 87 in a wall thereof and is guided by rollers 89 supported within the tank into a pool C of molten metal such as aluminum. By means of conventional coating techniques, the shape 82 is coated with metal from the pool C. If the metal 82 is steel or copper, it may be molecularly bonded with aluminum from pool C provided that its temperature as extruded or cast and as fed into the pool C is above the melting temperature of the aluminum. The shape 82 may be fed through a seizing die 88 at the exit opening in the tank 86 passing therefrom with a coating 82C thereon which may vary from a thousandth of an inch to several thousandths of an inch or more in thickness. The shape is then passed through a second tank 90 containing a liquid or vaporous chemical such as described which is operable during the passage of said shape through said tank to convert all or part of the coating 82C to a non-conducting compound of the metal coating. The coating may comprise aluminum oxide or other compounds of aluminum having the desired dielectric characteristics, hardness and wear resistence. From tank 90 coated shape 82' is fed to a second rolling mill 94 having upper rolls 95 and lower rolls 96 which cooperate to work the dielectric coating 82' on the surface of the shape 82. The rolls may also be operable to work the metal beneath the coating to improve its crystalling structure and, in certain instances change its shape or cross section.

A number of variations in the operation of the apparatus 80 are noted. Firstly, the rolling mill 83 may be eliminated if the shape is produced to the desired dimensions by extruding or casting machine 81 or if the rolling mill 94 is operable to properly finish the shape and its coating. Secondly, rolling mill 94 may be eliminated if the coating 82' is of proper and desired characteristic as formed. Further, means other than molten metal coating, such as electro-plating, electroless plating, spray coating, etc. may be utilized to provide a suitable metal coating on the exposed surface or an predetermined portion of the shape 82.

Tank 90 contains an inlet 92 to its interior 91 and an outlet 93 therefrom for flowing anodizing or oxidizing chemicals to the inside thereof. Such chemicals may be controllably flowed to volume 91 or against the surfaces of shape 82 on a continuous or an intermittent basis. Tank 90 may be sufficiently long to permit the desired conversion of the coating 82C to the non-conducting compound of the metal. If the shape 82 is wire, it may be guided and driven back and forth around a plurality of powered rollers within tank 90 to extend its time therein. A master controller or computer may be utilized to control the operation of extruder or casting machine 81, the various powered rolls and mills, the supply of molten metal to pool C in tank 86 as well as the temperature thereof, the flow of chemicals into volume 91 and their removal or circulation and the operation of take-up roll or coiler motor 98 operating coiling machine 97.

In FIG. 14 processes using the apparatus 80 are illustrated. The unprocessed metal 100 in billet, powder or other form is fed and shaped either by extrusion means 101 or continuous casting means or, if it is already shaped, it is finished by means of roll forming or drawing means 102. Thereafter, the shape is fed by continuous conveyance 103 to continuous coating means 104 where it is continuously coated with metal. Note that this step may be bypassed if the shape is of a metal such as aluminum which may have its surface stratum converted to the non-conducting oxide or compound in the continuous anodizing step 105.

In yet another form of the invention, all or portions of the structures illustrated in FIGS. 1–14 may be formed of one or more of the known semi-conducting materials to provide electrical circuit components or integrated circuits thereof with conducting and non-conducting components applied and formed as described. For example, the elements 14,14″,14a and/or 17 of FIGS. 1–4, either or both the elements 36 and 36 of FIGS. 7 and 8 or any of the metallic elements of FIGS. 9 and 10 may comprise suitable semi-conducting materials or components thereof which are converted to the non-conducting oxides thereof as described along selected portions of the original layers or films thereof which are deposited or otherwise applied to the substrates. Such semiconducting films as silicon, germanium, compounds of GaAs, InP and InAs, CdS, CdSe, PbS and ZnS, SiN (silicon Nitride) etc. may be deposited by by various known means such as vapor or electroless deposition or other means or may be epitaxially grown on the substrates described and illustrated in the drawings and thereafter selectively anodized or converted to nonconducting oxides or other compounds thereof to provide semi-conducting material pathways or isolate portions of the deposited materials for the fabrication of a variety of electrical circuits and circuit elements employing conducting, semi-conducring and insulating components which may expend as a multiplicity of same to provide high density integrated circuits capable of performing switching and logic-computing functions at high speeds.

In addition to the use of copper and aluminum for the metal films which are anodized in situ on the substrates described or on each other, such other metals as tantalum, silicon, nickel, nickel-chromium and other highly conducting metals and alloys or compounds thereof may also be used for the originally deposited films described herein which are selectively converted in situ to the non-conducting or to semi-conducting compounds thereof.

It is also noted that the metal films described and illustrated in the drawings may also comprise super conducting films such as films of lead, tin and indium which are selectively converted to non-conducting or semi-conducting compounds thereof by selectively exposing them to suitable chemicals for effecting such conversion. Ferromagnetic films employed to produce switching elements or arrays thereof on the substrate or on previously deposited film materials may also be selectively converted to non-magnetic film materials in areas such as described above to provide selective strips or otherwise shaped portions of the magnetic films in circuit with conducting films which are formed as described to provide high density arrays of switching devices such as memories and the like.

I claim:

1. An electrical device comprising a device supporting substate, a semi-conducting material on said substrate, said semi-conducting material having a portion thereof converted to its non-conducting oxide to a selected depth with non-converted semi-conducting material adjacent at least two opposed sides of said non-conducting oxide, said non-conducting oxide comprising means for restraining the flow of electrons between the separated non-converted portions of said semi-conducting material.

2. An electrical device in accordance with claim 1 wherein said oxide portion of said semi-conducting material serves as a barrier between portions of said semi-conducting material adjacent thereto.

3. An electrical device in accordance with claim 1 wherein said oxide portion of said semi-conducting material extends completely through said layer of semi-conducting material.

4. An electrical device in accordance with claim 1 wherein said oxide portion of said semi-conducting material extends only partially through said layer of semi-conducting material.

* * * * *